(12) United States Patent
Shin et al.

(10) Patent No.: US 11,778,851 B2
(45) Date of Patent: Oct. 3, 2023

(54) LIGHT-EMITTING DISPLAY DEVICE AND METHOD OF MANUFACTURING THE SAME

(71) Applicant: LG Display Co., Ltd., Seoul (KR)

(72) Inventors: Sang-Il Shin, Paju-si (KR); Hyun-Gi Lee, Gumi-si (KR); Boo-Heung Lee, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 195 days.

(21) Appl. No.: 17/133,742

(22) Filed: Dec. 24, 2020

(65) Prior Publication Data

US 2021/0202904 A1 Jul. 1, 2021

(30) Foreign Application Priority Data

Dec. 26, 2019 (KR) .......................... 10-2019-0175565

(51) Int. Cl.
*H10K 50/844* (2023.01)
*H10K 59/122* (2023.01)
*H10K 71/00* (2023.01)

(52) U.S. Cl.
CPC ......... *H10K 50/844* (2023.02); *H10K 59/122* (2023.02); *H10K 71/00* (2023.02)

(58) Field of Classification Search
CPC ............. H01L 27/3244; H01L 27/3246; H01L 27/3211; H01L 51/5237; H01L 51/5253; H01L 51/5278; H01L 51/56; H01L 2227/323; H10K 50/844; H10K 59/122; H10K 71/00

See application file for complete search history.

(56) References Cited

U.S. PATENT DOCUMENTS

| 2014/0225089 | A1* | 8/2014 | Kato ................... H01L 51/5012 257/40 |
| 2014/0264300 | A1* | 9/2014 | Kamiya .............. H01L 51/5271 257/40 |
| 2016/0043151 | A1* | 2/2016 | Kato ................... H01L 27/3246 257/40 |
| 2016/0126498 | A1* | 5/2016 | Kim .................... H01L 51/5234 257/40 |
| 2019/0237514 | A1* | 8/2019 | Tsukamoto ............ G09F 9/302 |
| 2019/0372052 | A1 | 12/2019 | Kishimoto et al. |

FOREIGN PATENT DOCUMENTS

| EP | 2 779 264 A2 | 9/2014 |
| EP | 3 016 167 A1 | 5/2016 |
| KR | 10-2016-0015815 A | 2/2016 |
| KR | 10-2016-0065436 A | 6/2016 |
| KR | 10-2018-0052912 A | 5/2018 |
| KR | 10-2019-0014962 A | 2/2019 |

OTHER PUBLICATIONS

Indian Office Action dated Jan. 12, 2022 issued in corresponding Patent Application No. 202014054734 (8 pages).
European Search Report dated Jun. 8, 2021 issued in corresponding Patent Application No. 20217147.6 (11 pages).

\* cited by examiner

*Primary Examiner* — Shaun M Campbell
(74) *Attorney, Agent, or Firm* — POLSINELLI PC (57) ABSTRACT

A light-emitting display device configured such that an area in which particles are generated is determined in an inspection process after formation of a light-emitting device and correspondingly a cover pattern is formed and a method of manufacturing the same. The particles are prevented from serving as a permeation path of impurities, whereby reliability of the light-emitting display device is improved.

16 Claims, 6 Drawing Sheets

LIGHT-EMITTING DISPLAY DEVICE AND METHOD OF MANUFACTURING THE SAME

CROSS REFERENCE TO RELATED APPLICATION

This application claims the benefit of Korean Patent Application No. 10-2019-0175565, filed on Dec. 26, 2019, which is hereby incorporated by reference in its entirety.

BACKGROUND

Field of the Disclosure

The present disclosure relates to a display device, and more particularly to a light-emitting display device configured such that damage to an organic layer due to permeation of impurity ions is prevented through a constructional change thereof and a method of manufacturing the same.

Description of the Background

With recent approach to a full-scale information age, displays capable of visually expressing electrical information signals have been rapidly developed. Correspondingly, various flat panel display devices having excellent performance, such as slimness, light weight, and low power consumption, have been developed and have rapidly replaced a conventional cathode ray tube (CRT).

Concrete examples of the flat panel display devices include a liquid crystal display (LCD) device, a plasma display panel (PDP) device, a field emission display (FED) device, and an organic light-emitting display (OLED) device.

Thereamong, the organic light-emitting display device, which does not require a separate light source, has a compact structure, and is capable of displaying vivid colors, is considered as a competitive application.

The organic light-emitting display device includes an organic layer. Even when an electrode and a passivation layer are formed on the organic layer, however, the organic layer may be damaged by particles generated in a subsequent process.

SUMMARY

Accordingly, the present disclosure is directed to a light-emitting display device and a method of manufacturing the same that substantially obviate one or more problems due to limitations and disadvantages of the related art.

The present disclosure is also to provide a light-emitting display device configured such that an area in which particles are generated is determined in an inspection process after formation of a light-emitting device and correspondingly a cover pattern is formed, whereby reliability of the light-emitting display device is improved, and a method of manufacturing the same.

Additional advantages and features of the disclosure will be set forth in part in the description which follows and in part will become apparent to those having ordinary skill in the art upon examination of the following or may be learned from practice of the disclosure. The other advantages of the disclosure may be realized and attained by the structure particularly pointed out in the written description and claims hereof as well as the appended drawings.

In a light-emitting display device according to the present disclosure and a method of manufacturing the same, an area in which particles are generated is determined in an inspection process after formation of a light-emitting device and correspondingly a cover pattern is formed. The cover pattern is selectively formed in the area in which the particles are generated, whereby the particles are prevented from serving as a permeation path of impurities, and therefore reliability of the light-emitting display device is improved.

To achieve these and other advantages and in accordance with the purpose of the disclosure, as embodied and broadly described herein, a light-emitting display device includes a bank on a substrate configured to define emissive portions of a plurality of subpixels; a light-emitting device at each of the plurality of subpixels on the substrate, the light-emitting device including a first electrode, an organic layer, and a second electrode stacked; a particle cover pattern configured to cover a particle on the bank; and an encapsulation layer on the entire surface of the substrate and over the particle cover pattern.

In another aspect of the present disclosure, a method of manufacturing a light-emitting display device includes a first step of providing a bank configured to define emissive portions of a plurality of subpixels on a substrate and providing, at each of the plurality of subpixels, a light-emitting device including a first electrode, an organic layer, and a second electrode stacked; a second step of inspecting a particle on the substrate; a third step of forming a particle cover pattern configured to cover the particle; and a fourth step of providing an encapsulation layer on the entire surface of the substrate with covering the particle cover pattern.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION OF THE DISCLOSURE

Reference will now be made in detail to the various aspects of the present disclosure, examples of which are illustrated in the accompanying drawings. Wherever possible, the same reference numbers will be used throughout the drawings to refer to the same or like parts. In the following description of the present disclosure, a detailed description of known functions and configurations incorporated herein will be omitted when it may obscure the subject matter of the present disclosure. In addition, the terms used in the following description are selected in consideration of ease of preparation of the specification, and may be different from the names of parts constituting an actual product.

Shapes, sizes, ratios, angles, and numbers shown in the drawings to describe the aspects of the present disclosure are illustrative and thus are not limitative of the disclosure of the present disclosure. Wherever possible, the same reference numbers will be used throughout the drawings to refer to the same or like parts. Also, in the following description of the present disclosure, a detailed description of known technology incorporated herein will be omitted when it may obscure the subject matter of the present disclosure. In the case in which the terms "comprises," "has," or "includes" are used in this specification, other parts may be further added unless the term "only" is used. The singular forms are intended to include the plural forms as well, unless the context clearly indicates otherwise.

In interpreting components included in various aspects of the present disclosure, it is to be interpreted that an error range is included unless the context clearly indicates otherwise.

In explaining various aspects of the present disclosure, when a positional relationship is described, for example, when the positional relationship between two parts is described using terms such as "on", "above," "under," "beside," etc., one or more additional parts may be located between the two parts unless the term "immediately" or "directly" is used.

In explaining various aspects of the present disclosure, when a temporal relationship is described, for example, when time sequences such as "after," "subsequently," "next," and "before" are described, discontinuous sequences may be included unless the term "immediately" or "directly" is used.

In explaining various aspects of the present disclosure, the terms "first," "second," etc. are used to describe various elements. However, these terms are used only to distinguish between the elements. In this specification, therefore, a component identified by "first" may be identical to a component identified by "second" within the technical spirit of the present disclosure unless the context clearly indicates otherwise.

Features of various aspects of the present disclosure may be partially or entirely coupled to or combined with each other, and may be technically interlocked and driven in various manners. Various aspects may be realized independently or in combination with each other.

Hereinafter, a light-emitting display device according to the present disclosure and a method of manufacturing the same will be described.

A light-emitting display device according to the present disclosure includes self-emissive devices provided in an array without a separate light source unit. For example, the light-emitting display device may be an organic light-emitting display device, a micro LED display device, an electrophoretic display device, or a quantum-dot light-emitting display device. However, the above enumeration is merely an example, and any self-emissive display device may be extended to other applications.

Figure 1:
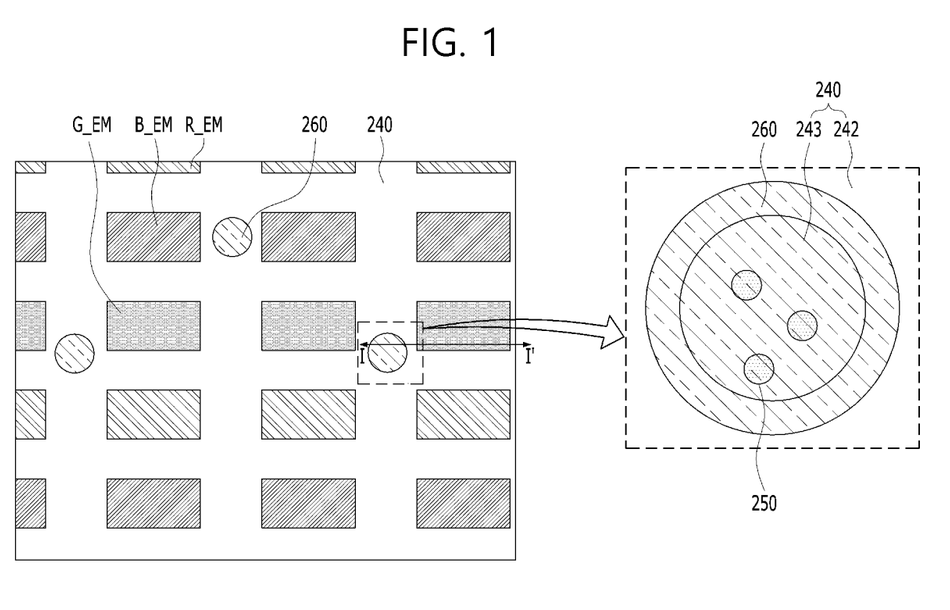
FIG. 1 is a plan view of a light-emitting display device according to the present disclosure.
Figure 2:
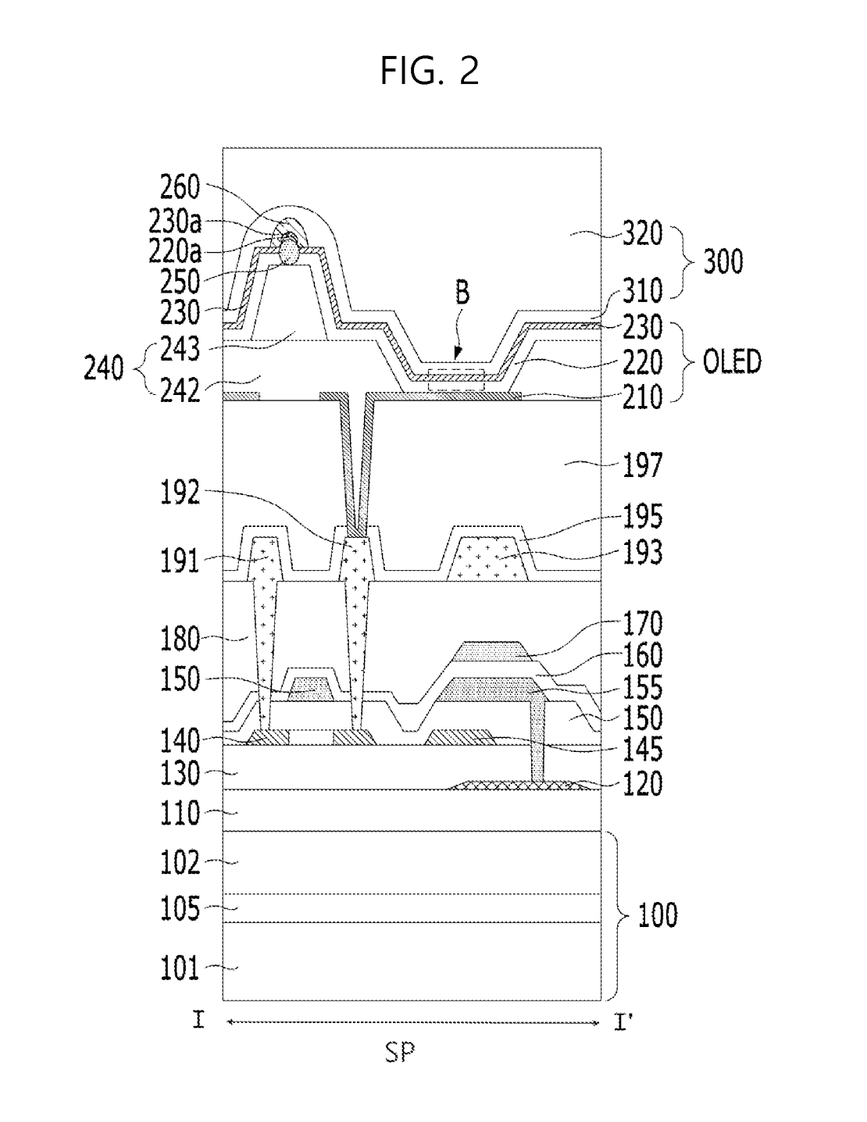
FIG. 2 is a cross-sectional view of a light-emitting display device according to a first aspect of the present disclosure taken along line I-I' of FIG. 1.
Figure 3:
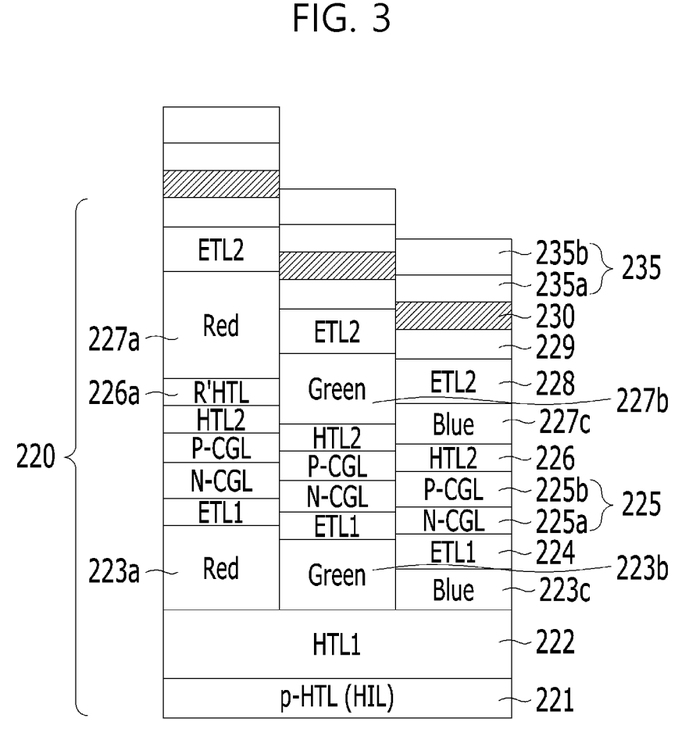
FIG. 3 is a cross-sectional view showing area B of FIG. 2.

FIG. 1 is a plan view of a light-emitting display device according to the present disclosure, and FIG. 2 is a cross-sectional view of a light-emitting display device according to a first aspect of the present disclosure taken along line I-I' of FIG. 1. In addition, FIG. 3 is a cross-sectional view showing area B of FIG. 2.

As shown in FIGS. 1 and 2, the light-emitting display device according to the present disclosure may include a bank 240 provided on a substrate 100, the bank 240 being configured to define emissive portions G_EM, B_EM, and R_EM of a plurality of subpixels SP, an organic light-emitting device (OLED) provided at each of the plurality of subpixels SP on the substrate 100, the organic light-emitting device (OLED) including a first electrode 210, an organic stack 220, and a second electrode 230, which are stacked, a particle cover pattern 260 configured to cover particles on the bank 240, and an encapsulation layer 300 disposed on the entire surface of the substrate 100 including the particle cover pattern 260.

In the light-emitting display device according to the present disclosure, the emissive portions G_EM, B_EM, and R_EM, which are provided in an open area of the bank 240, are continuously formed in a matrix.

Although the emissive portions G_EM, B_EM, and R_EM of the subpixels are shown as having the same size, the emissive portions G_EM, B_EM, and R_EM may have different sizes depending on circumstances, e.g. depending on display characteristics required by the device. For example, the emissive portion B_EM of each blue subpixel may be the largest, the emissive portion G_EM of each green subpixel may be second largest, and the emissive portion R_EM of each red subpixel may be the smallest. The reason for this is that efficiency of a blue light-emitting material is the lowest, and therefore the emissive portion B_EM of each blue subpixel has the largest size in order to correspond in light-emitting efficiency to the other colors. The reason that the size of the emissive portion G_EM of each green subpixel is greater than the size of the emissive portion R_EM of each red subpixel is that dependence on green light emission is the greatest at the time of expression of a white color, and therefore the size of the emissive portion G_EM of each green subpixel may be greater than the size of the emissive portion R_EM of each red subpixel. However, the sizes of the emissive portions G_EM, B_EM, and R_EM may be differently changed as long as material development is accompanied.

Here, the sizes of the emissive portions G_EM, B_EM, and R_EM are influenced by the shape of the bank 240. The open area of the bank 240 is adjusted to define the emissive portions G_EM, B_EM, and R_EM of the subpixels. In the case in which the area of the bank that occupies a relevant subpixel is large, the size of the emissive portion of the subpixel is reduced.

Although each of the emissive portions G_EM, B_EM, and R_EM is shown as being rectangular, each of the emissive portions G_EM, B_EM, and R_EM may be polygonal rather than rectangular, circular, or oval. Depending on circumstances, each of the emissive portions G_EM, B_EM, and R_EM may have rounded corners.

Meanwhile, in the open area of the bank 240, the emissive portions G_EM, B_EM, and R_EM, are spaced apart from each other. In the entirety of the bank 240, the emissive portions G_EM, B_EM, and R_EM, each of which has a predetermined area, are regularly perforated in the shape of a hole.

Each subpixel SP is an imaginary area having the emissive portion G_EM, B_EM, or R_EM disposed at the center thereof and a portion of the bank 240 surrounding the emissive portion. In the case in which the sizes of the emissive portions G_EM, B_EM, and R_EM are different from each other, the size of each subpixel SP may be changed.

Each subpixel includes an organic light-emitting device OLED provided in the emissive portion G_EM, B_EM, or R_EM thereof.

The organic light-emitting device OLED includes first and second electrodes 210 and 230, which are opposite each other, and an organic stack 220 disposed between the first and second electrodes 210 and 230. Here, the organic stack 220 includes a plurality of stacked organic layers, including an emissive layer. In order to provide an emissive layer of a color corresponding to a predetermined subpixel, deposition may be performed using a fine metal mask (FMM) having an opening corresponding to the emissive portion thereof.

Meanwhile, FIG. 1 shows an example in which the particle cover pattern 260 is formed on a portion of the bank 240.

The bank 240 includes a bank pattern 242 configured to occupy the area other than the emissive portions G_EM, B_EM, and R_EM and a spacer 243 formed on a portion of the bank pattern 242 in the shape of an island. The spacer 243 is provided to prevent the fine metal mask (FMM) from directly contacting the bank pattern 242 as the result of drooping of the fine metal mask (FMM) due to the weight thereof and thus to prevent the bank pattern 242 from being deformed or damaged when the fine metal mask (FMM) is used during formation of the organic stack of the organic light-emitting device OLED. The bank pattern 242 and the spacer 243 may be made of the same material, and may be sequentially formed using a single mask, e.g. a diffraction light exposure mask or a half-tone mask having both a transmission portion and a semi-transmission portion. The spacer 243 is provided to prevent the fine metal mask (FMM) from contacting the bank pattern 242, and may be formed only on a portion of the upper part of the bank pattern 242.

However, the spacer 243 may contact the fine metal mask during each deposition process of the organic stack for the purpose thereof. The fine metal mask is located in a single chamber, and is repeatedly used in the same deposition process for several panels. Particles may remain on the fine metal mask in the chamber during the deposition process of a previous panel, and the particles on the fine metal mask may be transferred to the spacer 243 of a next panel as the result of contact with the fine metal mask during the deposition process of the next panel. Each of the particles may serve as foreign matter on the substrate 100. Each of the particles may be an organic material used during the deposition process of the organic layers. Consequently, each of the particles may include the same material as at least one layer of the organic stack 220 between the first and second electrodes 210 and 230.

In the chamber, the fine metal mask may be used in deposition processes performed several times to several tens of times, and each of the particles stacked on the fine metal mask may be thicker than the thickness of a single organic layer formed in a single deposition process. For example, each of the particles may have a height of 0.1 μm to 5.0 μm. In addition, each of the particles may be formed in a single process. In most cases, however, each of the particles may have a predetermined size or higher through organic deposition processes performed several times, and may be transferred to the upper side of the substrate 100. Some of the foreign matter scattered in the chamber may remain on the fine metal mask, and may be transferred to the substrate when the fine metal mask contacts the spacer 243. The particles 250 located on the substrate 100 substantially have no typical form, and may be irregularly distributed on the substrate 100.

As described above, the fine metal mask mainly contacts the upper surface of the spacer 243, and the particles 250 are transferred to the spacer 243 as the result of contact between the fine metal mask and the spacer 243. Consequently, the particles 250 are mainly observed on the upper surface of the spacer 243.

In the case in which the bank 240 is constituted by only the bank pattern 242 as the result of omission of the spacer 243, the particles 250 may remain on the bank pattern 242, and the particle cover pattern 260 according to the present disclosure may be formed on the bank pattern 242 so as to completely cover the particles 250.

In addition, the particles 250 are mainly formed on the spacer 243 in the organic layer formation process using the fine metal mask.

Meanwhile, the height of each of the particles 250 may be thicker than a single organic layer of the organic stack 220. After being transferred to the spacer 243, therefore, a large step is formed between the area of the spacer 243 on which the particles 250 are formed and the peripheral area of the spacer 243, whereby the organic layers formed during the organic stack formation process and the second electrode 230 may be separated from an organic layer material 220a and a second electrode material 230a on the particles 250.

The particle cover pattern 260 is an island-shaped pattern configured to cover the particles 250, and is provided based on determination in position and size of the particles 250 after inspection of the particles 250 after formation of the organic light-emitting device.

Consequently, the particle cover pattern 260 follows the shape and position of each of the particles 250. That is, in the case in which each of the particles has a height of 1 μm, the particle cover pattern 260 is formed on the particles 250 using an inkjet method so as to be distributed wider than the particles 250 while exceeding the height of each of the particles 250, i.e. 1 μm, and is then hardened thereon.

The particle cover pattern 260 is made of, for example, an acryl resin material, which is used to protect the particles 250, which are made of an organic material, without movement thereof and to prevent introduction of external impurity ions.

The side part of the particle cover pattern 260 is formed so as to be gentler than abrupt inclination of each of the particles 250, whereby the particle cover pattern 260 sufficiently covers the particles 250.

In addition, the particle cover pattern 260 covers the particles 250, which are not stratiform but are atypically or randomly disposed, and has wider distribution than the particles 250. That is, the planar area of the particle cover pattern 260 is larger than the particles 250.

Meanwhile, the particle cover pattern 260 is covered by an inorganic encapsulation layer 310 provided on the substrate 100, and the inorganic encapsulation layer 310 is covered by an organic encapsulation layer 320.

The encapsulation layer 300 includes at least one pair of an inorganic encapsulation layer 310 and an organic encapsulation layer 320, and may further include an inorganic encapsulation layer and/or an organic encapsulation layer, as shown in FIG. 2.

In the light-emitting display device according to the present disclosure, the shape of the particle cover pattern 260 may not be continuous, and the particle cover pattern 260 may be formed on only the area in which the particles 250 are formed. The particle cover pattern 260 may individually correspond to several particles 250 or, in the case in which there are particles 250 clustered for one spacer 243, as shown in FIG. 1, a single particle cover pattern 260 may correspond to a plurality of particles 250 clustered in the spacer 243.

The side part of the particle cover pattern 260 is gently formed so as to protect the side part of each particle 250 without exposure. Even when there are impurity ions in the encapsulation layer 300, which is subsequently formed, therefore, the particle cover pattern 260 prevents the impurity ions from permeating through the circumference of each particle 250, whereby it is possible to improve reliability of the light-emitting display device.

Hereinafter, elements that were not described with reference to FIGS. 2 and 3 will be described.

When the light-emitting display device is used as, for example, a flexible display device, the substrate 100 may be constituted by a single polymer, or may include a first polymer layer 101, an inorganic interlayer dielectric film 105, and a second polymer layer 102, which are stacked, as shown in FIG. 2. In this case, the interlayer dielectric film 105 is provided between the polymer layers 101 and 102, each of which is made of an organic material, whereby the interlayer dielectric film 105 interrupts a permeation path that the organic material may have in the vertical direction. The substrate 100 may be made of a single organic polymer layer or glass. In this case, the composition or thickness thereof may be adjusted to prevent formation of the permeation path.

Each of the first polymer layer 101 and the second polymer layer 102 is made of an organic material, such as polyimide or polyamide. In a third aspect, the second polymer layer 102 may be made of a transparent organic resin. The first polymer layer 101 may be made of a transparent organic resin or a colored organic resin.

The interlayer dielectric film 105 may be a silicon inorganic film, such as SiOx, SiOxNy, or SiNx.

At least one buffer layer 110 and an active buffer layer 130 may be formed on the substrate 100. The buffer layer 110 is provided to prevent external permeation, and the active buffer layer 130 is provided to prevent impurities from permeating into first and second active layers 140 and 145, which will be formed thereon.

A thin film transistor including a first active layer 140, a gate electrode 150 disposed so as to overlap a channel of the first active layer 140, and a source electrode 191 and a drain electrode 192 connected to opposite sides of the first active layer 14 may be provided in a predetermined area on the active buffer layer 130.

Here, a gate dielectric layer 147 may be provided between the first active layer 140 and the gate electrode 150 of the thin film transistor, and a first interlayer dielectric layer 160 and a second interlayer dielectric layer 180 may be further provided between the gate electrode 150 and the source/drain electrode 191/192.

In addition, a storage capacitor may be further provided to maintain uniform voltage at a node of the drain electrode 192 or the source electrode 191 of the thin film transistor. The storage capacitor may be defined by a first storage electrode 170 formed on the first interlayer dielectric layer 160, a second storage electrode 193 formed on the same layer as the source/drain electrode 191/192, and an interlayer dielectric layer 180 disposed therebetween. In the example shown in FIG. 2, a third storage electrode 155 is further provided on the same layer as the gate electrode 150 so as to overlap the first and second storage electrodes 170 and 193 in order to increase the capacity of the storage capacitor in a limited area. Structurally, it is possible to increase storage capacitance through parallel connection of the storage capacitor based on triple or more stacking of storage electrodes.

In addition, a lower light-shielding pattern 120 may be further formed on the buffer layer 110, and may be electrically connected to the third storage electrode 155 via a contact hole formed through the gate dielectric film 147 and the active buffer layer 130. A second active layer 145 disposed on the same layer as the first active layer 140 may be further located between the lower light-shielding pattern 120 and the third storage electrode 155.

Meanwhile, an inorganic passivation film 195 is formed so as to cover the source/drain electrode 191/192, and a planarization film 197 is further formed thereon for surface planarization. The planarization film 197 may have a contact hole formed therein by exposing a portion of the drain electrode 192, and the first electrode 210 formed on the planarization film 197 may be connected to the drain electrode 192 via the contact hole in the planarization film 197. The inorganic passivation film 195 may be omitted depending on circumstances.

The bank pattern 242 is formed so as to overlap the edge of the first electrode 210 in order to expose the emissive portion R_EM, G_EM, or B_EM (see FIG. 1).

In FIG. 2, the organic stack 220, formed between the first electrode 210 and the second electrode 230 of the organic light-emitting device (OLED), is shown as having a single layer. As an example, however, a plurality of stacks divided by a charge generation layer 225 may be provided, as shown in FIG. 3. In addition, some of the plurality of organic layers may be commonly formed for the subpixels, and layers provided at only relevant subpixels, such as color emissive layers, may be included. Consequently, the organic stack 220 may include layers commonly formed for the subpixels and layers spaced apart from each other for each subpixel.

FIG. 3 shows an example in which two stacks 221 to 224 and 226 to 228 are stacked. However, the present disclosure is not limited thereto. The organic stack 220 may include three or more stacks or a single stack. The plurality of stacks has an advantage in that a longer lifespan is secured at the same luminance than the single stack. The plurality of stacks has an advantage in a light-emitting display device for vehicles that requires a long lifespan.

Meanwhile, the lower stack may include a hole injection layer 221 including a p-type dopant configured to allow holes to be easily injected through the interface with the first electrode 210, a first hole transport layer 222, first emissive layers 223a, 223b, and 223c, and a first electron transport layer 224.

The charge generation layer 225 may be constituted by stacking an n-type charge generation layer 225a and a p-type charge generation layer 225b or may be formed as a single layer.

The upper stack may include a second hole transport layer 226, second emissive layers 227a, 227b, and 227c, a second electron transport layer 228, and an electron injection layer 229.

Each of the subpixels R_SP, G_SP, and B_SP will be described.

The first red emissive layer 223a of the red subpixel R_SP is provided in the lower stack, a hole auxiliary transport layer 226a is further provided on the second hole transport layer 226 in the upper stack, and the second red emissive layer 227a is formed on the hole auxiliary transport layer 226a.

The first green emissive layer 223b of the green subpixel G_SP is provided in the lower stack, and the second green emissive layer 227b is formed on the second hole transport layer 226 in the upper stack.

The first blue emissive layer 223c of the blue subpixel B_SP is provided in the lower stack, and the second blue emissive layer 227c is formed on the second hole transport layer 226 in the upper stack.

The vertical distances between the first electrode 210 and the first red emissive layer 223a, the first green emissive layer 223b, and the first blue emissive layer 223c, which are provided in the same lower stack, and between the first electrode 210 and the second red emissive layer 227a, the second green emissive layer 227b, and the second blue emissive layer 227c, which are provided in the same upper stack, are different from each other. To this end, the emissive layers have different heights. Also, in the upper stack of the red subpixel SP, the hole auxiliary transport layer 226a may be further provided between the second hole transport layer 226 and the second red emissive layer 227a in consideration of process requirements of the second hole transport layer 226 commonly formed with adjacent subpixels and the emissive area of the second red emissive layer 227a. The hole auxiliary transport layer 226a may be omitted depending on circumstances.

Meanwhile, in the shown example, the first and second red emissive layers 223a and 227a may phosphoresce, and the first and second green emissive layers 223b and 227b and the first and second blue emissive layers 223c and 227c may phosphoresce. However, this is merely an example, and the green or blue emissive layers may be formed as phosphorescent emissive layers, in addition to the red emissive layers.

However, in the structure in which the color emissive layers are divided for each color subpixel, a color emissive layer deposition process must be performed using a fine metal mask having an opening corresponding to the emissive portion of a predetermined subpixel in order to form each color emissive layer. In this case, the particles 250 in the chamber or on the fine metal mask may be transferred to the spacer 243 on the substrate during use of the fine metal mask to form the color emissive layer. In the present disclosure, it is possible to prevent the abruptly inclined side parts of the particles 250 from serving as a permeation path of impurity ions generated during the process.

Meanwhile, a phosphorescent emissive layer including a phosphorescent dopant has relatively low resistance to impurity ions. The reason for this is that the phosphorescent dopant is constituted by a combination of a heavy metal and a ligand and impurity ions, such as F-ions, break the combination of the heavy metal and the ligand.

Meanwhile, a capping layer 235 configured to protect the organic light-emitting device (OLED) and to improve the light extraction effect may be further provided on the second electrode 230. The capping layer 235 may include an organic capping layer 235a and an inorganic capping layer 235b, which are stacked, in order to improve the light extraction effect based on the refractive index difference.

The encapsulation layer 300, which includes the inorganic encapsulation layer 310 and the organic encapsulation layer 320, is provided on the capping layer 235.

In the light-emitting display device according to the present disclosure, the particles, generated during the process and remaining on the substrate, are inspected, and the particle cover pattern is formed so as to cover the particles in order to prevent the particles from affecting the light-emitting devices therein.

In addition, it is possible for the particle cover pattern to prevent a phenomenon in which the upper encapsulation layer is cracked by the tapered structure of each of the particles or the element formed on each of the particles and thus serves as a permeation path and to protect the inner organic layer. Consequently, it is possible to protect the device in each subpixel and to prevent formation of black spots. Eventually, it is possible to improve reliability of the light-emitting display device.

Hereinafter, a second aspect of the light-emitting display device according to the present disclosure will be described.

Figure 4:
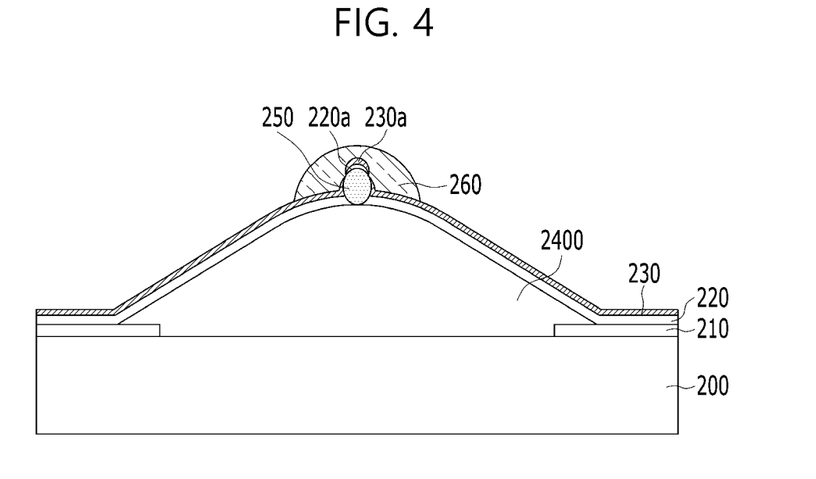
FIG. 4 is a cross-sectional view of a light-emitting display device according to a second aspect of the present disclosure.

FIG. 4 is a cross-sectional view of a light-emitting display device according to a second aspect of the present disclosure.

As shown in FIG. 4, the light-emitting display device according to the second aspect of the present disclosure is different from the first aspect in that a bank pattern and a spacer are unified to form a bank 2400.

In FIG. 4, the structure from the substrate 100 to the planarization film 197 of FIG. 2 is expressed as a substrate 200 in order to describe the features of the disclosure, and the state in which a light-emitting device is formed on the substrate and a particle cover pattern 260 is formed after detection of particles is shown.

In this case, particles 250 may correspond to any area on the planarization film 197 as long as the particles 250 are present in a chamber configured to form an organic stack as well as an emissive layer deposition process. Since the bank 2400 is structurally higher than an emissive portion, however, a portion of the upper surface of the bank 2400 becomes an area which a fine metal mask contacts at the time of formation of an emissive layer, and the particles 250 are detected on the uppermost surface of the bank 2400 or in the vicinity of the circumference thereof.

After inspection of the particles 250, a particle cover pattern 260 is formed in the shape of an island so as to cover the particles 250.

In the same manner as in the first aspect, the particles may be irregularly and atypically formed, and the particle cover pattern 260 has a larger width and height than the shape of each of the detected particles 250 so as to sufficiently cover the particles 250.

In the light-emitting display device according to the second aspect of the present disclosure, the particles, generated during the process and remaining on the substrate, are inspected, and the particle cover pattern is formed so as to cover the particles, whereby it is possible to prevent the particles from affecting the light-emitting devices therein.

In addition, it is possible for the particle cover pattern to prevent a phenomenon in which the upper encapsulation layer is cracked by the tapered structure of each of the particles or an element formed on each of the particles and thus serves as a permeation path and to protect an inner organic layer. Consequently, it is possible to protect the device in each subpixel and to prevent formation of black spots. Eventually, it is possible to improve reliability of the light-emitting display device.

Figure 5:
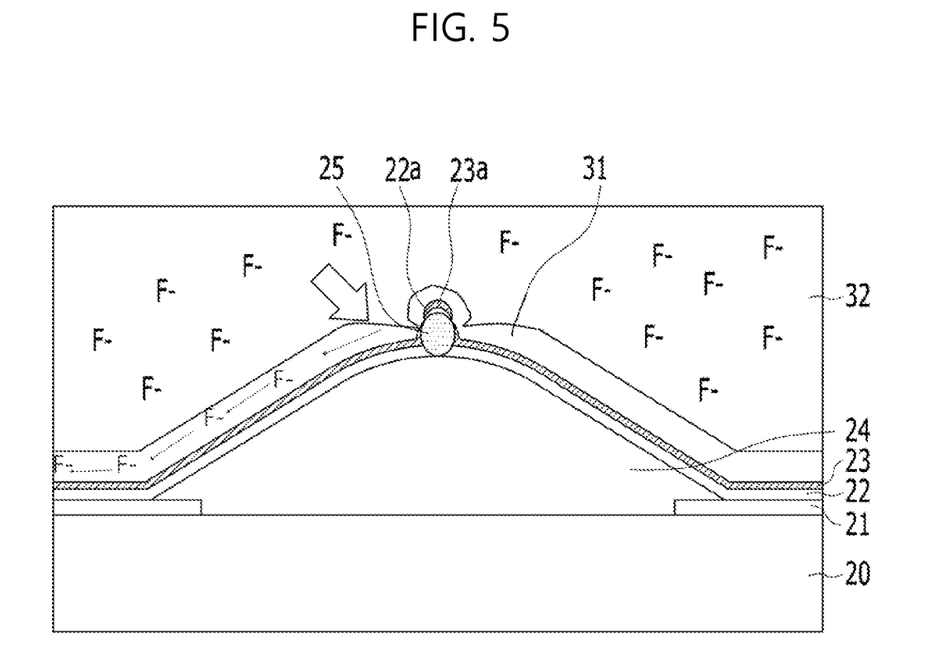
FIG. 5 is a cross-sectional view showing transmission of impurity ions in a structure having no particle cover pattern.

FIG. 5 is a cross-sectional view showing transmission of impurity ions in a structure having no particle cover pattern.

Particles remaining on a deposition mask used when a deposition process is performed with respect to a plurality of panels or present in a chamber are transferred to a substrate as the result of contact with the substrate. Each of the particles is an organic composition including carbon. In addition, each of the particles is a material that is accumulated or scattered during deposition processes performed several times to several tens of times and is capable of being clustered. Each of the particles is atypical.

As shown in FIG. 5, particles 25 themselves cause no problem but, since each of the particles 25 has a larger thickness than the construction of a light-emitting device, an organic stack 22 and a second electrode 23 join with the particles 25, whereby structural gaps are formed on the surfaces thereof and an inorganic encapsulation layer 31, which is subsequently formed, causes cracks at the side parts of the particles 25. In addition, the cracks may serve as a permeation path of impurities, such as F-ions remaining in an organic encapsulation layer 32, whereby the impurities may affect the organic stack 22 through the second electrode 23, which has a small thickness, and may damage a phosphorescent emissive layer, which has particularly high sensitivity to impurity ions. The phosphorescent emissive layer includes a phosphorescent dopant having a combination of a heavy metal, such as iridium, and a ligand, and F-ions break the combination of the phosphorescent dopant, whereby deterioration of the phosphorescent emissive layer affected by the impurities is accelerated, which has a direct influence on luminance, a lifespan, etc.

In the light-emitting display device according to the present disclosure, the particles, which may serve as a permeation path of impurity ions, are detected, and the particle cover pattern configured to cover the particles is provided, whereby it is possible to prevent the particles from affecting the light-emitting devices therein.

Hereinafter, a method of manufacturing the light-emitting display device according to the present disclosure will be described with reference to the drawings.

FIGS. 6A to 6D are process cross-sectional views showing a method of manufacturing the light-emitting display device according to the second aspect of the present disclosure.

Figure 6A:
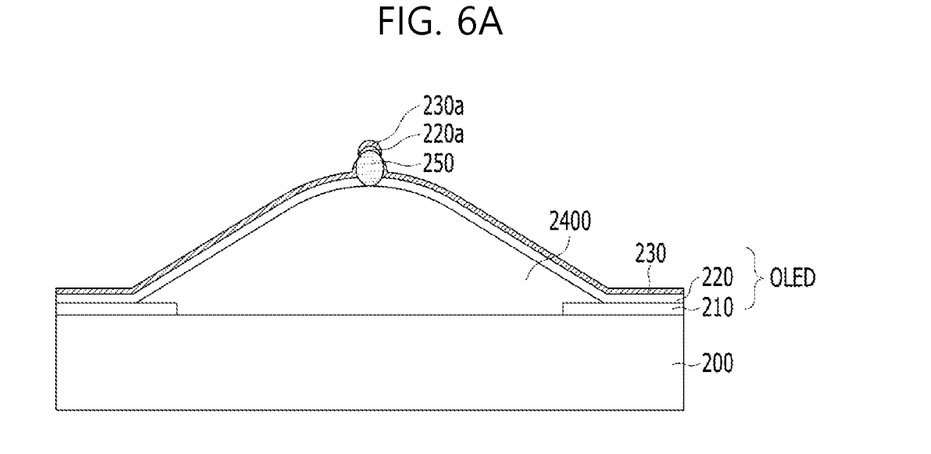
FIGS. 6A to 6D are cross-sectional views showing a method of manufacturing the light-emitting display device according to the second aspect of the present disclosure.

In the method of manufacturing the light-emitting display device according to the present disclosure, as shown in FIG. 6A, a bank 240 configured to define emissive portions of a plurality of subpixels is provided on a substrate 200, and an organic light-emitting device (OLED) including a first electrode 210, an organic stack 220, and a second electrode 230, which are stacked, is provided at each of the plurality of subpixels.

As shown in FIGS. 1 and 2, the bank 2400 may be replaced with a bank pattern 242 configured to define the emissive portions of the plurality of subpixels in an open area and a spacer 243 provided on the bank pattern 242.

Figure 6B:
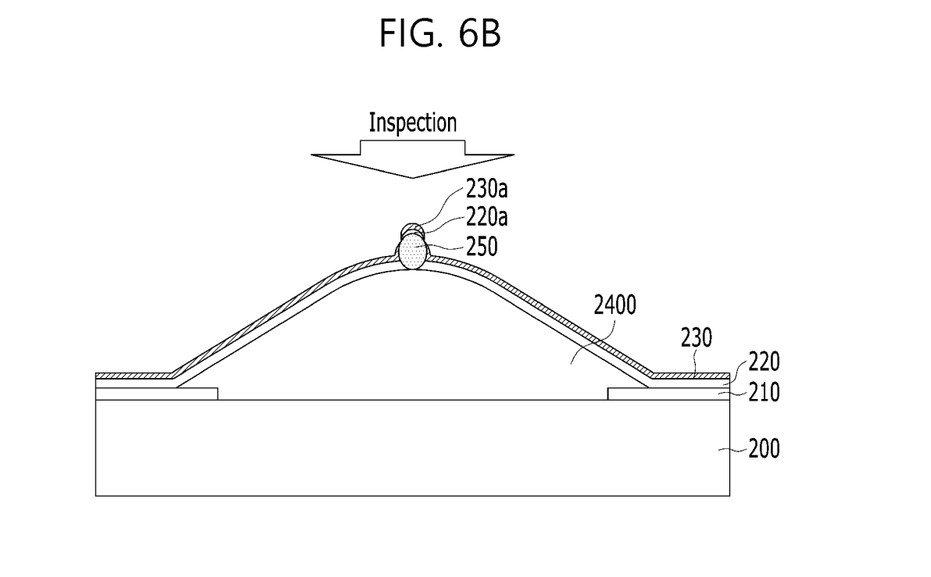

Subsequently, as shown in FIG. 6B, the position and size of each of particles 250 generated on the substrate 200 during the process of forming the organic stack 220 or the second electrode 230 are determined.

The size of each of the particles 250 may be determined based on the horizontal diameter and height of each particle.

As shown, the particles may be generated in the area other than the bank 2400 depending on circumstances. For example, in the case in which the particles are generated in the emissive portion of each subpixel, a repair process may be performed.

As shown in FIGS. 1 and 2, the particles 250 may be generated on only the spacers 243.

Figure 6C:
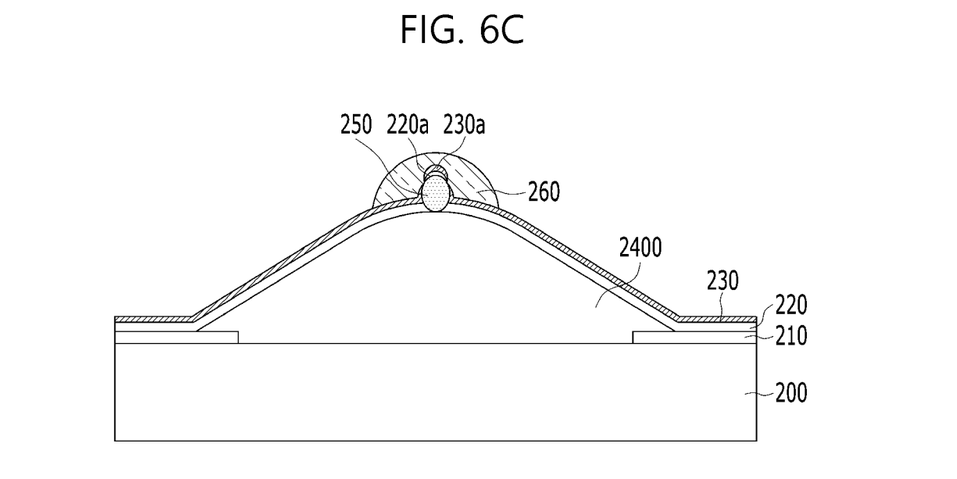

Subsequently, as shown in FIG. 6C, a particle cover pattern 260 configured to cover the particles 250 is formed. In this case, a liquid acrylic resin may be coated and hardened such that the particle cover pattern 260 completely covers the particles 250. Coating may be performed using a method of selectively coating a liquid material, such as inkjet coating or slit coating.

The particle cover pattern 260 is formed so as to be larger than the horizontal diameter and height of each particle 250, and the sidewall of the particle cover pattern 260 is gently formed such that the inclination of the particle cover pattern 260 is gentler than the tapered structure of each particle, whereby an inorganic encapsulation layer 310 (see FIG. 6D), which will be subsequently formed, is formed along the gentle sidewall of the particle cover pattern 260.

Figure 6D:
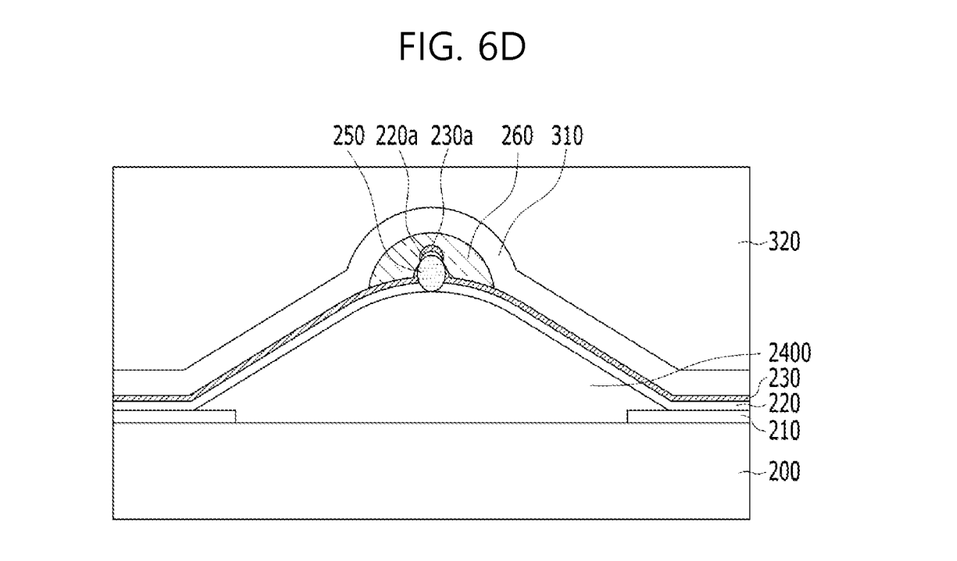

Subsequently, as shown in FIG. 6D, an inorganic encapsulation layer 310 and an organic encapsulation layer 320 are sequentially formed on the entire surface of the substrate 20 including the particle cover pattern 260.

To this end, a light-emitting display device according to an aspect of the present disclosure may include a bank on a substrate configured to define emissive portions of a plurality of subpixels; a light-emitting device at each of the plurality of subpixels on the substrate, the light-emitting device including a first electrode, an organic layer and a second electrode which are stacked; a particle cover pattern configured to cover particles on the bank; and an encapsulation layer disposed on the entire surface of the substrate and over the particle cover pattern.

In addition, each of the particles may include the same material or the same composition as the organic layer.

The particle cover pattern may include an acrylic resin.

A spacer may be further provided on the bank.

The particle cover pattern may be over the spacer.

The encapsulation layer may include an inorganic encapsulation layer and an organic encapsulation layer, and the inorganic encapsulation layer may abut the particle cover pattern.

An organic layer pattern and a second electrode pattern may be further provided on each of the particles so as to abut each of the particles, and the particle cover pattern may cover the organic layer pattern and the second electrode pattern together with each of the particles.

The organic layer includes a plurality of organic stacks, each of which has an emissive layer, a lower common layer formed under the emissive layer, and an upper common layer formed on the emissive layer, and includes a charge generation layer disposed between the organic stacks. The lower common layer and the upper common layer of each of the organic stacks are continuous over adjacent subpixels, and the emissive layers of the organic stacks are spaced apart from each other between adjacent subpixels.

At least one of the emissive layers of the organic stacks may include phosphorescent emissive material.

The diameter and height of the particle cover pattern may be greater than the diameter and height of each of the particles.

The light-emitting device may further include a capping layer on the second electrode, and the particle cover pattern may abut the capping layer.

Also, in order to accomplish the feature, a method of manufacturing a light-emitting display device according to the present disclosure may include a first step of providing a bank configured to define emissive portions of a plurality of subpixels on a substrate and providing, at each of the plurality of subpixels, a light-emitting device including a first electrode, an organic layer, and a second electrode stacked; a second step of inspecting particles on the substrate; a third step of forming a particle cover pattern configured to cover the particles; and a fourth step of providing an encapsulation layer on the entire surface of the substrate with covering the particle cover pattern.

The first step may further include a step of providing a spacer on the bank.

In the second step, the diameter, height, and position of each of the particles may be determined.

The third step may include a step of coating and hardening a liquid acrylic resin so as to completely cover each of the particles.

Also, in the third step, the particle cover pattern may be formed so as to have an inclination gentler than the tapered structure of each of the particles.

As is apparent from the above description, a light-emitting display device according to the present disclosure and the method of manufacturing the same have the following effects.

First, particles generated during a process and remaining on a substrate are inspected, and the particle cover pattern is formed so as to cover the particles in order to prevent the particles from affecting light-emitting devices therein.

Second, it is possible for the particle cover pattern to prevent a phenomenon in which an upper encapsulation layer is cracked by the tapered structure of each of the particles or an element formed on each of the particles and thus serves as a permeation path and to protect an inner organic layer. Consequently, it is possible to protect the device in each subpixel and to prevent formation of black spots. Eventually, it is possible to improve reliability of the light-emitting display device.

It will be apparent to those skilled in the art that the present disclosure described above is not limited to the above aspects and the accompanying drawings and that various substitutions, modifications, and variations can be made without departing from the technical idea of the present disclosure.

What is claimed is:

1. A light-emitting display device comprising:
    a bank defining emissive portions of a plurality of subpixels and disposed on a substrate;
    a light-emitting device disposed at each subpixel on the substrate and comprising first and second electrodes and an organic layer disposed between the first and second electrodes;
    a particle cover pattern selectively deposited only on a region vertically overlapping the bank to completely cover a particle on the bank; and
    an encapsulation layer disposed on an entire surface of the substrate and disposed over the particle cover pattern.

2. The light-emitting display device according to claim 1, wherein the particle comprises an identical material to the organic layer.

3. The light-emitting display device according to claim 1, wherein the particle cover pattern includes an acrylic resin.

4. The light-emitting display device according to claim 1, further comprising a spacer disposed on the bank.

5. The light-emitting display device according to claim 4, wherein the particle cover pattern is disposed onto the spacer and a size of the particle cover pattern is less than a size of the spacer.

6. The light-emitting display device according to claim 1, wherein the encapsulation layer comprises an inorganic encapsulation layer and an organic encapsulation layer, and the inorganic encapsulation layer abutting the particle cover pattern.

7. The light-emitting display device according to claim 1, further comprising an organic layer pattern and a second electrode pattern disposed on the particle so as to abut the particle,
wherein the particle cover pattern covers the organic layer pattern and the second electrode pattern together with the particle.

8. The light-emitting display device according to claim 1, wherein the organic layer comprises:
    a plurality of organic stacks, each organic stack having an emissive layer, a lower common layer formed under the emissive layer, and an upper common layer formed on the emissive layer; and
    a charge generation layer disposed between the organic stacks,
    wherein the lower common layer and the upper common layer of each of the organic stacks are continuously disposed over adjacent subpixels, and
    wherein the emissive layers of the organic stacks are spaced apart from each other between adjacent subpixels.

9. The light-emitting display device according to claim 8, wherein at least one of the emissive layers of the organic stacks comprises a phosphorescent emissive material.

10. The light-emitting display device according to claim 1, wherein a diameter of the particle cover pattern is greater than a diameter of the particle, and a height of the particle cover pattern is greater than a height of the particle.

11. The light-emitting display device according to claim 1, wherein an inclination of a side part of the particle cover pattern is less steep than an inclination of a side part of the particle, and the side part of the particle cover pattern is on the bank.

12. The light-emitting display device according to claim 1, wherein the light-emitting device further comprises a capping layer on the second electrode, and the particle cover pattern abuts the capping layer.

13. A light-emitting display device comprising:
    a bank disposed on a substrate and comprising a bank pattern defining emissive portions of a plurality of subpixels and a spacer formed on a portion of the bank pattern;
    a light-emitting device disposed at each of the plurality of subpixels on the substrate and comprising first and second electrodes and an organic layer disposed between the first and second electrodes;
    a particle cover pattern selectively disposed only on a region vertically overlapping the spacer to completely cover a particle on the spacer; and
    an encapsulation layer disposed on an entire surface of the substrate and over the particle cover pattern.

14. The light-emitting display device according to claim 13, wherein the bank pattern and the spacer are integrated to form the bank.

15. The light-emitting display device according to claim 1, wherein the particle cover pattern is disposed on the area in which the particle is disposed.

16. The light-emitting display device according to claim 6, wherein the particle cover pattern is covered by the inorganic encapsulation layer and the inorganic encapsulation layer abutting the particle cover pattern is covered by the organic encapsulation layer which does not abut the particle cover pattern.

* * * * *